(12) United States Patent
Kim et al.

(10) Patent No.: US 10,411,216 B2
(45) Date of Patent: Sep. 10, 2019

(54) LIGHT EMITTING DEVICE AND MANUFACTURING METHOD THEREFOR

(71) Applicant: Foundation of Soongsil University—Industry Cooperation, Seoul (KR)

(72) Inventors: Do Hwan Kim, Anyang-si (KR); Moon Sung Kang, Seoul (KR); Sang Sik Park, Seoul (KR); Seok Hwan Kong, Seoul (KR)

(73) Assignee: FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 0 days.

(21) Appl. No.: 16/072,682

(22) PCT Filed: Jan. 11, 2017

(86) PCT No.: PCT/KR2017/000379
§ 371 (c)(1),
(2) Date: Jul. 25, 2018

(87) PCT Pub. No.: WO2017/131366
PCT Pub. Date: Aug. 3, 2017

(65) Prior Publication Data
US 2018/0331317 A1    Nov. 15, 2018

(30) Foreign Application Priority Data

Jan. 25, 2016  (KR) .................... 10-2016-0008700
Oct. 17, 2016  (KR) .................... 10-2016-0134181

(51) Int. Cl.
*H01L 51/52*   (2006.01)
*H01L 51/56*   (2006.01)
(Continued)

(52) U.S. Cl.
CPC ...... *H01L 51/5203* (2013.01); *H01L 51/0097* (2013.01); *H01L 51/5032* (2013.01);
(Continued)

(58) Field of Classification Search
CPC ............ H01L 25/0753; H01L 27/3281; H01L 27/156; H01L 33/0045
See application file for complete search history.

(56) References Cited

U.S. PATENT DOCUMENTS

2003/0127973 A1   7/2003  Weaver et al.
2004/0016886 A1   1/2004  Ringermacher et al.
(Continued)

FOREIGN PATENT DOCUMENTS

KR   10-2005-0016489 A    2/2005
KR   10-2007-0098929 A   10/2007
(Continued)

OTHER PUBLICATIONS

International Search Report for International Application No. PCT/KR2017/000379, dated Apr. 11, 2017.
(Continued)

*Primary Examiner* — Dung A. Le
(74) *Attorney, Agent, or Firm* — Pearne & Gordon LLP

(57) ABSTRACT

A light emitting device and a manufacturing method therefor are provided, and the light emitting device includes an active layer including a light emitting material, an ionic material, and a polymer matrix, and the active layer is capable of being compressed and elongated and formed to be changed in luminous intensity depending on at least one of a pressure for the active layer and an elongation percentage of the active layer.

20 Claims, 9 Drawing Sheets

(51) Int. Cl.
*H01L 51/00* (2006.01)
*H01L 51/50* (2006.01)

(52) U.S. Cl.
CPC .......... *H01L 51/56* (2013.01); *H01L 51/0035* (2013.01); *H01L 51/0085* (2013.01); *H01L 51/0086* (2013.01); *H01L 51/502* (2013.01); *H01L 2251/5338* (2013.01)

(56) References Cited

U.S. PATENT DOCUMENTS

| | | | |
|---|---|---|---|
| 2006/0105149 A1 | 5/2006 | Donahue | |
| 2009/0242871 A1* | 10/2009 | Kobayashi | ........... C09K 11/025 257/13 |
| 2012/0200532 A1 | 8/2012 | Powell et al. | |
| 2015/0129843 A1 | 5/2015 | Liu | |
| 2015/0243920 A1* | 8/2015 | Edman | ................ H01L 51/5016 257/13 |

FOREIGN PATENT DOCUMENTS

| | | |
|---|---|---|
| KR | 10-2008-0027404 A | 3/2008 |
| KR | 10-2012-0017779 A | 2/2012 |

OTHER PUBLICATIONS

Jiangxin Wang et al., "Extremely Stretchable Electroluminescent Devices with Ionic Conductors," Advanced Materials, 2015, vol. 28(22), pp. 4490-4496.

* cited by examiner

10

ANION

CATION

LIGHT EMITTING DEVICE AND MANUFACTURING METHOD THEREFOR

CROSS-REFERENCE TO RELATED APPLICATION

This application claims priority to and the benefit of PCT Patent Application No. PCT/KR2017/000379 filed on Jan. 11, 2017, Korean Patent Application No. 10-2016-0134181 filed on Oct. 17, 2016, and Korean Patent Application No. 10-2016-0008700 filed on Jan. 25, 2016, in the Korean Intellectual Property Office, the entire disclosures of which are incorporated herein by reference.

TECHNICAL FIELD

The present disclosure relates to a light emitting device and a manufacturing method therefor.

BACKGROUND

Conventional light sources have been limited in application to flexible devices due to their physical and mechanical properties such as hard and inflexible materials. Recently, a deformable and stretchable light source has attracted a lot of attention in order to provide flexible electronic devices.

Currently, studies to provide stretchiness to light emitting devices are being conducted. In a conventional light emitting device having stretchiness, a transparent electrode material is embedded in an elastic polymer material to provide elasticity to an electrode which has a minimized decrease in electrical properties during tensile strain or a light emitting material is dispersed in an elastic polymer material with stretchiness to provide stretchiness.

However, the conventional flexible light emitting device has a low elongation percentage of about 100% and requires a high driving voltage for light emission and decreases in electrical properties and luminous intensity at the same time as being elongated.

In this regard, Korean Patent Laid-open Publication No. 10-2012-0017779 (entitled "Flexible organic light-emitting diodes and manufacturing method thereof") discloses a method of manufacturing flexible organic light-emitting diodes by performing electric field annealing to a FOLED including a polymer anode layer formed on a flexible substrate, a light emitting layer formed on the polymer anode layer, an electron injection layer formed on the light emitting layer, and a cathode layer formed on the electron injection layer.

DISCLOSURE OF THE INVENTION

Problems to be Solved by the Invention

Some embodiments of the present disclosure are conceived to provide a flexible and stretchable light emitting device and a manufacturing method therefor.

Further, some embodiments of the present disclosure are conceived to provide a light emitting device which can be driven at a low voltage.

However, problems to be solved by the present disclosure are not limited to the above-described problems. There may be other problems to be solved by the present disclosure.

Means for Solving the Problems

As a means for solving the above-described technical problem, a light emitting device according to an aspect of the present disclosure includes: an active layer including a light emitting material, an ionic material, and a polymer matrix, and the active layer is capable of being compressed and elongated and formed to be maintained or increased in luminous intensity depending on compression and elongation percentage.

Further, a manufacturing method for a light emitting device according to another aspect of the present disclosure includes: forming a first electrode; forming an active layer in which a light emitting material, an ionic material, and a polymer matrix are mixed, on an upper part of the first electrode; and forming a second electrode on an upper part of the active layer. Herein, the active layer is capable of being compressed and elongated and formed to be maintained or increased in luminous intensity depending on compression and elongation percentage.

Effects of the Invention

A light emitting device manufactured according to an embodiment of the present disclosure is flexible and stretchable and can be applied to flexible electronic devices such as a flexible light source.

Further, a light emitting device manufactured according to an embodiment of the present disclosure can be applied as a tactile or pressure sensor that senses an external stimulus such as a pressure or stress directly relevant to deformation of the device and shows the external stimulus as a visual signal.

Furthermore, a light emitting device manufactured according to an embodiment of the present disclosure can be driven at a low voltage and can be manufactured as a very thin and lightweight light emitting device due to excellent processability of a polymer material.

MODE FOR CARRYING OUT THE INVENTION

Figure 1:
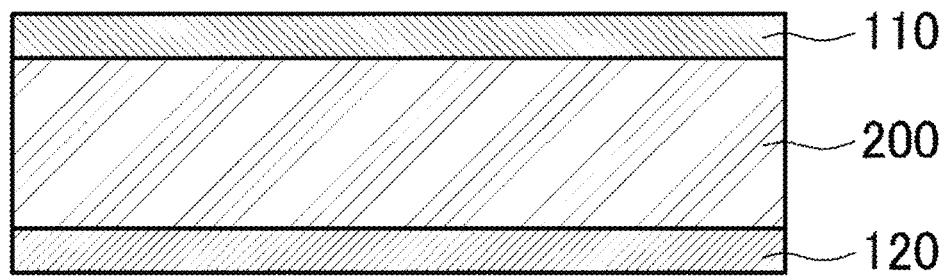
FIG. 1 is a schematic diagram illustrating a light emitting device according to an embodiment of the present disclosure.

Hereinafter, embodiments of the present disclosure will be described in detail with reference to the accompanying drawings so that the present disclosure may be readily implemented by a person with ordinary skill in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Hereinafter, a light emitting device and a manufacturing method therefor according to an embodiment of the present disclosure will be described in detail with reference to the accompanying drawings.

FIG. 1 is a schematic diagram illustrating a light emitting device according to an embodiment of the present disclosure.

Referring to FIG. 1, a light emitting device 10 according to an embodiment of the present disclosure includes a first electrode 110, a second electrode 120, and an active layer 200 formed between the first electrode 110 and the second electrode 120.

The first electrode 110 and the second electrode 120 are formed of conductive materials and configured to apply a voltage to the active layer 200. Further, at least one of the first electrode 110 and the second electrode 120 may be formed of a light transmitting material. The first electrode 110 and the second electrode 120 may be formed of metal such as aluminum (Al), gold (Au), platinum (Pt), and nickel (Ni) or a combination thereof. Further, the first electrode 110 and the second electrode 120 may be formed as a carbon electrode containing graphene, carbon nano tube (CNT), and the like, a mesh type metal nanowire film, a metal grid, and a metal oxide electrode such as indium tin oxide (ITO). However, these materials of the first electrode 110 and the second electrode 120 are just examples and the present disclosure is not limited thereto.

Further, the first electrode 110 and the second electrode 120 have stretchiness and elasticity and may be formed by, for example, but not limited to, embedding, buckling, and the like.

The active layer 200 formed between the first electrode 110 and the second electrode 120 directly emits light and has physical and mechanical properties during light emission. In this case, the active layer 200 may include a light emitting material, an ionic material, and a polymer matrix.

The polymer matrix may be formed using an elastic body such as a thermoplastic elastomer or a thermal curable elastomer. The thermoplastic elastomer may include, for example, any one of thermoplastic polyurethane, styrene-butadiene rubber (SBR), and ethylene-propylene rubber (EPR), but may not be limited thereto. The thermal curable elastomer may include, for example, any one of thermal curable polyurethane and polydimethylsiloxane (PDMS), but may not be limited thereto.

As the light emitting material, an ionic or neutral transition metal complex, a light emitting organic semiconductor, a quantum dot material, or the like may be used. Examples of a transition metal compound may include ruthenium (Ru) and iridium (Ir). For example, the light emitting material may include any one of tris (2,2'-bipyridine)ruthenium (II) hexafluorophosphate [Ru(bpy)$_3$ (PF$_6$)$_2$], tris(4,7-diphenyl-1,10-phenanthroline)ruthenium(II) bis (hexafluorophosphate) [Ru(dp-phen)$_3$ (PF$_6$)$_2$], bis(2-phenylpyridine) (2,2'-dipyridine)-iridium(III) hexafluorophosphate[Ir(ppy)$_2$ (bpy) PF$_6$], bis(2-phenylpyridine) (4,4'-di-tert-butyl-2,2'-dipyridyl)-iridium(III) hexafluorophosphate[Ir(dtbbpy) (ppy)$_2$ PF$_6$], and 4,4'-di-tert-butyl-2,2'-dipyridyl-bis[2-(2',4'-difluorophenyl)pyridine]-iridium(III) hexafluorophosphate[Ir(ppy-F$_2$)$_2$ (dtb-bpy)PF$_6$], but may not be limited thereto.

Further, the light emitting organic semiconductor may include a conjugated organic semiconductor capable of emitting light such as a light emitting monomer and a light emitting polymer. For example, the light emitting organic semiconductor may include any one of rubrene, anthracene, decycloxyphenyl substituted poly (1,4-phenylene vinylene [Super yellow], poly (2-methoxy-5-(2-ethylhexyloxy)-1,4-phenylenevinylene) [MEH-PPV], poly (2-methoxy-5-(3',7'-dimethyloctyloxy)-1,4-phenylenevinylene) [MEMO-PPV], and poly (9,9-dioctylfluorene-alt-benzothiadiazole) [F8BT], but may not be limited thereto.

Furthermore, the quantum dot material may include at least one of inorganic compounds of elements from Groups 13 to 15, Groups 12 to 16, and Groups 14 to 16. For example, the quantum dot material may include any one of CdSe, CdS, ZnSe, InP, PbS, and PbSe, but may not be limited thereto.

Figure 2A:
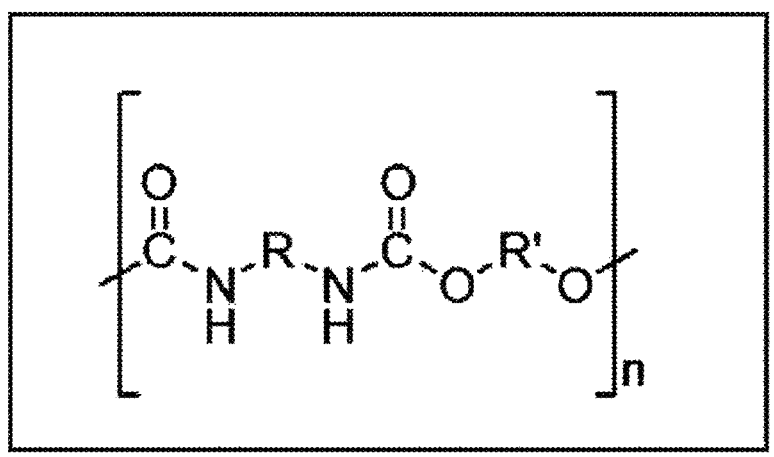
FIGS. 2A and 2B are diagrams illustrating an example of a polymer matrix and an ionic material considered in an embodiment of the present disclosure.
Figure 2B:
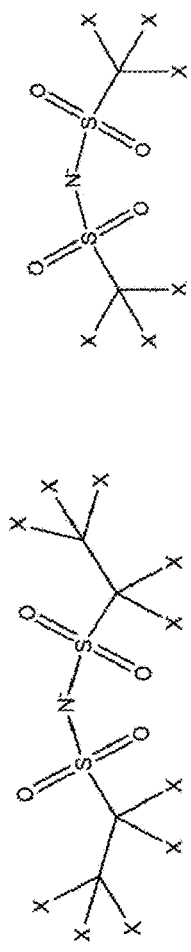
Figure 2B:
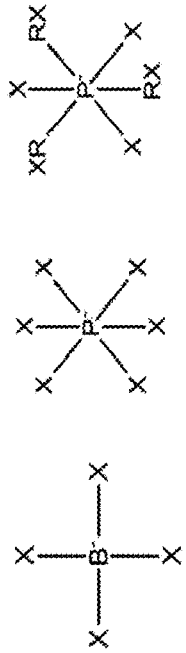
Figure 2B:
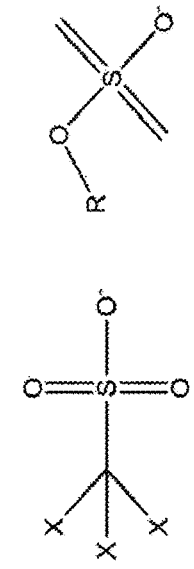
Figure 2B:
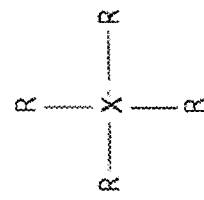
Figure 2B:
Figure 2B:
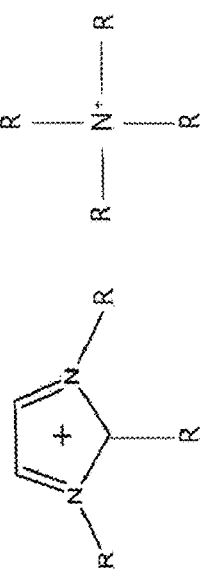
Figure 2B:
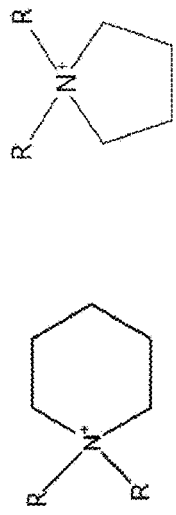
Figure 2B:
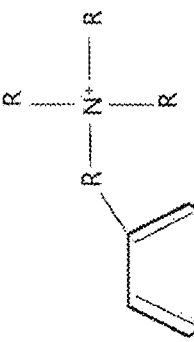
Figure 2B:
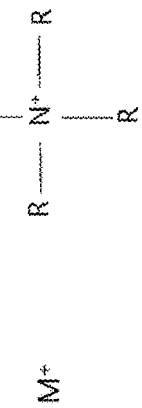
Figure 2B:

FIG. 2A and FIG. 2B are diagrams illustrating an example of a polymer matrix and an ionic material considered in an embodiment of the present disclosure.

In FIG. 2B and FIG. 2B, "X" represents halogen, "M" represents an alkaline metal element, and "R" and "R'" may be any one of aliphatic and aromatic hydrocarbon and function groups.

As illustrated in FIG. 2A, the polymer matrix may be thermoplastic polyurethane. In this case, thermoplastic polyurethane is formed of a segmented block copolymer including hard segments having a rigid molecular structure and soft segments having a flexible molecular structure. In this case, a ratio of the hard segments and the soft segments may be controlled in various ways.

The hard segment has a glass transition temperature Tg higher than room temperature. Therefore, a physical cross-linking point is formed between the glassy hard segments due to crystal formation, hydrogen bonding, or combination of van der Waals forces. Meanwhile, the soft segment has a glass transition temperature lower than room temperature. Therefore, the soft segments are provided with essential properties (i.e., a high drawing ratio, a high modulus of elasticity, a high elastic recovery, etc.) required for a rubbery elastic body. Therefore, the light emitting device 10 according to an embodiment of the present disclosure has stretchiness and flexibility.

As illustrated in FIG. 2B, the ionic material includes cations or anions, and may be a solid electrolyte or a liquid electrolyte.

The liquid electrolyte may be a material composed of only cations and anions present in liquid form at room temperature without containing a solvent therein.

The solid electrolyte may be a polymer electrolyte including a polymer with ion transferability and alkali salt or may be a solid salt itself. The polymer in the solid electrolyte may include any one of poly ethylene oxide (PEO), poly acrylonitrile (PAN), poly vinylidene fluoride (PVDF), and poly methyl methacrylate (PMMA), but may not be limited thereto.

The segments included in the above-described polymer matrix may divide the inside of the active layer 200 into sections and isolate the cations or anions included in the ionic material. Further, when applied with an external force, the segments may cause a change in the orientation and structure of the segments.

Hereinafter, a light emitting principle of the light emitting device 10 according to an embodiment of the present disclosure will be described in detail.

When a potential difference is applied to the first electrode 110 and the second electrode 120, cations and anions included in an ionic liquid of the active layer 200 move to the vicinity of the electrodes. For example, a DC voltage or AC voltage may be applied to the first electrode 110 and the second electrode 120. In this case, if a positive voltage is applied to the first electrode 110 and a negative voltage is applied to the second electrode 120, the cations included in the ionic liquid within the active layer 200 move to the first electrode 110 and the anions move to the second electrode 120. Specifically, in the vicinity of the first electrode, there is an increase in chemical species reduced by obtaining electrons from the electrode. Therefore, the cations included in the ionic liquid move to the first electrode 110 to maintain electrical neutrality. Meanwhile, in the vicinity of the second electrode 120, there is an increase in chemical species oxidized by giving electrons to the electrode. Therefore, the anions included in the ionic liquid move to the second electrode 120 to maintain electrical neutrality.

Figure 3:
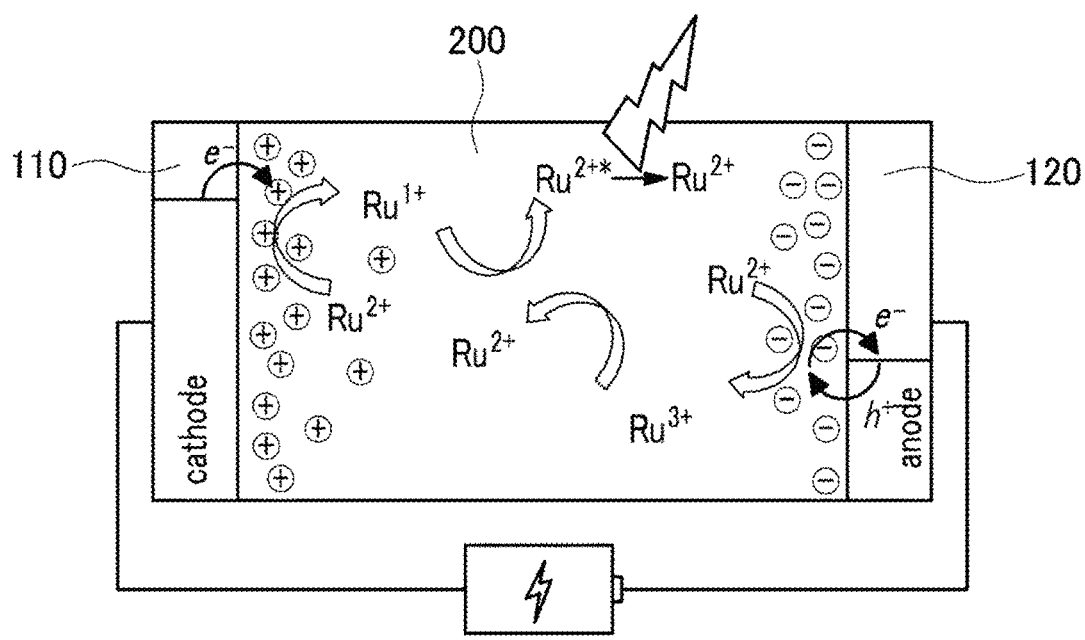
FIG. 3 is a diagram provided to schematically explain a light emitting principle of a light emitting device according to an embodiment of the present disclosure.

FIG. 3 is a diagram provided to schematically explain a light emitting principle of a light emitting device according to an embodiment of the present disclosure.

As illustrated in FIG. 3, in an embodiment of the present disclosure, the ionic transition metal complex may be tris (2,2'-bipyridine)ruthenium(II) Hexafluorophosphate and $Ru(bpy)_3(PF_6)_2$). Therefore, the active layer 200 may contain cations, anions, and ruthenium ions ($Ru^{2+}$). When a DC voltage or AC voltage is applied to the first electrode 110 and the second electrode 120, an oxidation or reduction reaction may occur in the first electrode 110 and the second electrode 120.

For example, a positive voltage may be applied to the first electrode 110 and a negative voltage may be applied to the second electrode 120. Therefore, $Ru^{2+}$ in the vicinity of the first electrode 110 are reduced to $Ru^{1+}$ ions by obtaining electrons and $Ru^{2+}$ ions in the vicinity of the second electrode 120 are oxidized to $Ru^{3+}$ ions by losing electrons. Then, when $Ru^{1+}$ ions and $Ru^{3+}$ ions are combined and excited to emit light while returning to a stable state. Meanwhile, if an AC voltage is applied, a negative voltage may be applied to the first electrode 110 and a positive voltage may be applied to the second electrode 120, and a negative voltage or a positive voltage may be applied alternately. In this case, an oxidation reaction may occur in the first electrode 110 and a reduction reaction may occur in the second electrode 120. That is, the oxidation/reduction reaction occurring in the first electrode 110 or the second electrode 120 may vary depending on application of a voltage and may occur without limitation to any one reaction.

In the light emitting device 10 according to an embodiment of the present disclosure, when a pressure is applied from the outside or a tensile force is applied to the active layer 200, the luminous intensity is increased. Specifically, when an external pressure or tensile force is applied, the segments dividing the inside of the active layer 200 are changed in shape and ions confined in the segments are released to the outside. Therefore, more ions are present in the vicinity of the first electrode 110 and the second electrode 120 and the rate of an oxidation-reduction reaction of $Ru^{2+}$ ions is increased, and, thus, the luminous intensity is increased.

Figure 4:
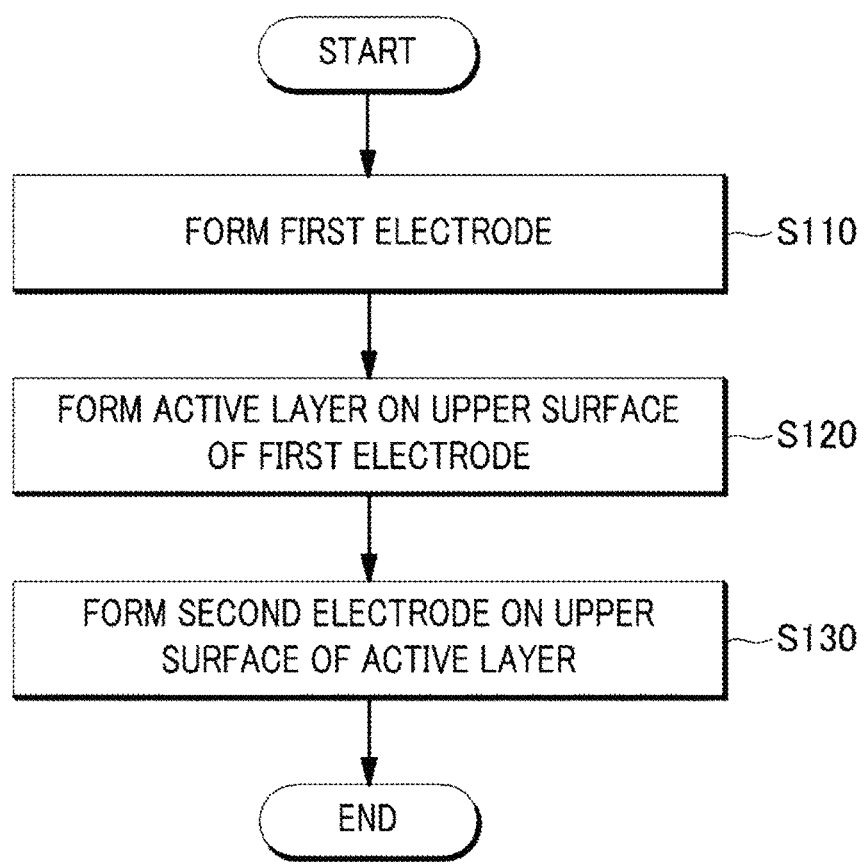
FIG. 4 is a flowchart provided to explain a manufacturing method for a light emitting device according to an embodiment of the present disclosure.

FIG. 4 is a flowchart provided to explain a manufacturing method for a light emitting device in detail according to an embodiment of the present disclosure.

Referring to FIG. 4, a manufacturing method for the light emitting device 10 according to an embodiment of the present disclosure includes: forming a first electrode (S110); forming an active layer on an upper surface of the first electrode (S120); and forming a second electrode on an upper surface of the active layer (S130).

However, the order of performing the process of forming the first electrode (S110), the process of forming the active layer (S120), and the process of forming the second electrode (S130) illustrated in FIG. 4 is not limited to that illustrated in FIG. 4.

Further, in the process of forming the first electrode (S110) and the process of forming the second electrode (S130), the first electrode may be first formed on a substrate in order to facilitate handling. In this case, the substrate is a typical substrate used for semiconductor device and may be formed using glass, quartz, silicon (Si), germanium (Ge), and the like. Then, the first electrode 110, the active layer 200, and the second electrode 120 may be arranged to be brought into contact with each other in sequence, and the substrate may be removed. In this case, the arrangement order of the first electrode 110 and the second electrode 120 is not limited as long as the active layer 200 is formed between the first electrode 110 and the second electrode 120.

In the process of forming the first electrode (S110), the first electrode 110 may be formed on a first substrate. First, a conductive material is formed on the first substrate. In this case, the conductive material on the first substrate may be formed by any one deposition method of thermal evaporation, chemical vapor deposition (CVD), plasma enhanced CVD (PECVD), low pressure CVD (LPCVD), physical vapor deposition (PVD), sputtering, or atomic layer deposition (ALD). Otherwise, the conductive material may be formed by a transferring method or an electrospinning method, such as spray coating or vacuum filtration, depending on conditions. Then, the conductive material may be patterned using photolithography or e-beam lithography to form the first electrode 110.

In the process of forming the active layer (S120), the active layer 200 may be arranged on an upper part of the first electrode 110. In this case, the active layer 200 may be formed by molding, etching, and spin coating by means of photocuring or thermal curing. First, a mixed solution in which thermoplastic polyurethane, an ionic liquid, and a transition metal compound are mixed may be prepared. Then, the mixed solution may be injected into a concavo-convex mold and cured therein to form the active layer 200, and then the active layer 200 may be separated from the mold.

In the process of forming the second electrode on the upper surface of the active layer (S130), a conductive material may be formed on a second substrate and then patterned to form the second electrode 120 in the same manner as in the process of forming the first electrode (S110). Then, the second electrode 120 may be arranged to be brought into contact with the active layer 200, and then the second substrate may be removed. The second electrode 120 may also be formed on an upper part of the active layer 200 without the second substrate.

In the above-described embodiment, the first electrode 110 and the second electrode 120 are formed on the first substrate and the second substrate, respectively, only for handling, and the first electrode 110 and the second electrode 120 can also be formed without using the substrates. Further, in the case where the first substrate or the second substrate is not removed, the first substrate and the second substrate may be formed of a light transmitting material. In this case, the light transmitting material may include any one of glass, ceramic, silicon, rubber, and plastic, but may not be limited thereto.

Figure 5A:
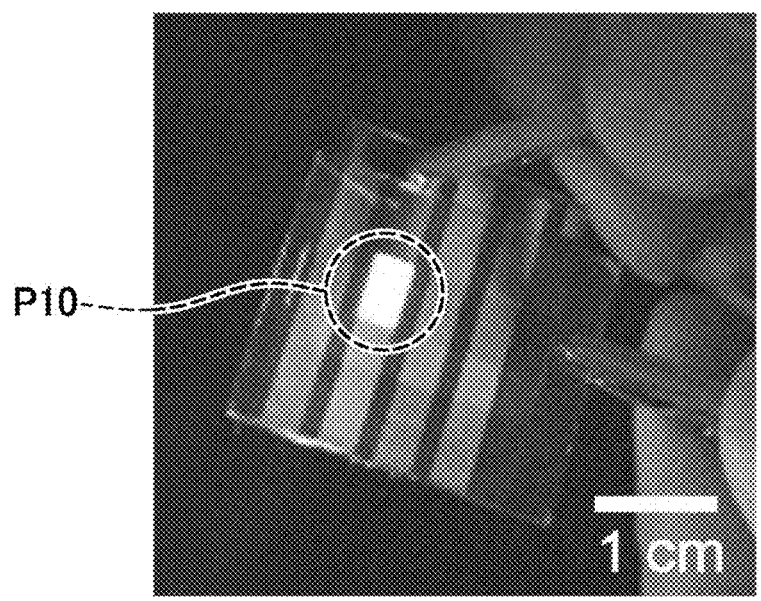
FIG. 5A and FIG. 5B provide a photo showing a light emitting state of a light emitting device manufactured according to an embodiment of the present disclosure and a driving condition graph thereof.
Figure 5B:
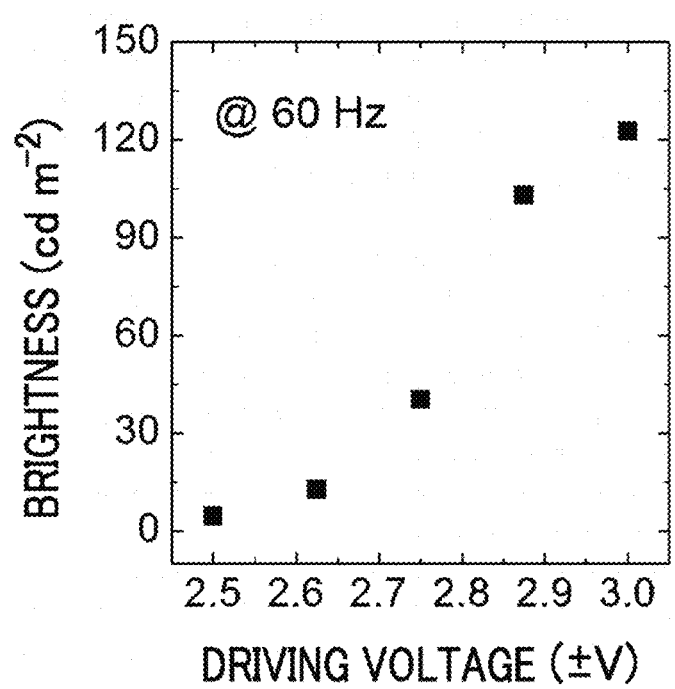
Figure 6A:
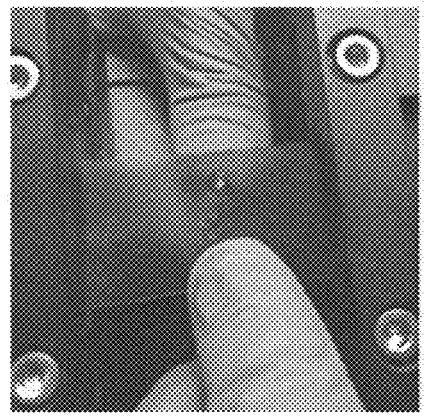
FIG. 6A, FIG. 6B, and FIG. 6C provide photos showing a change in luminous intensity depending on an elongation percentage of a light emitting device manufactured according to an embodiment of the present disclosure.
Figure 6B:
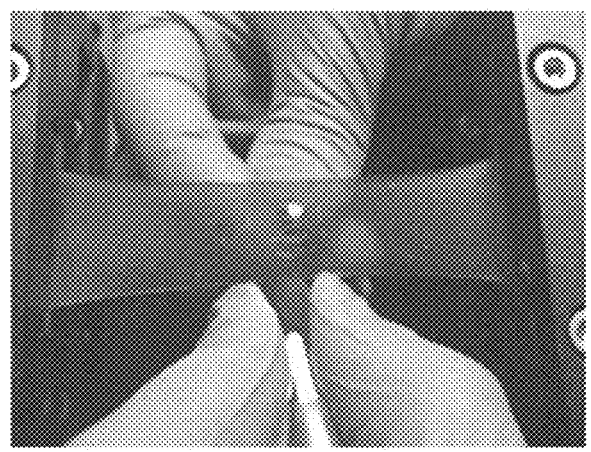
Figure 6C:
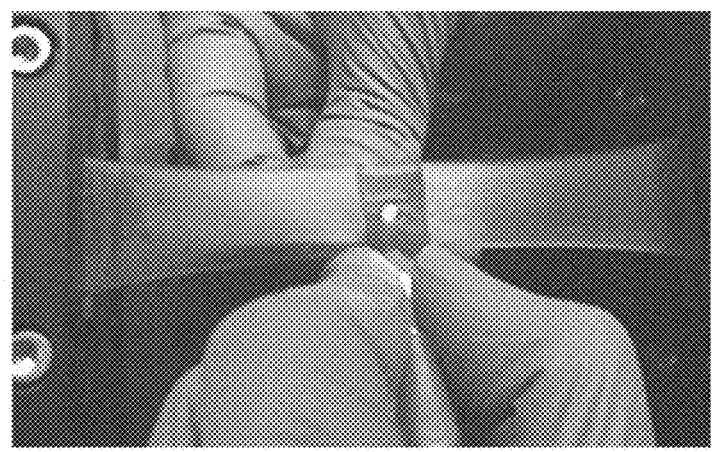
Figure 7A:
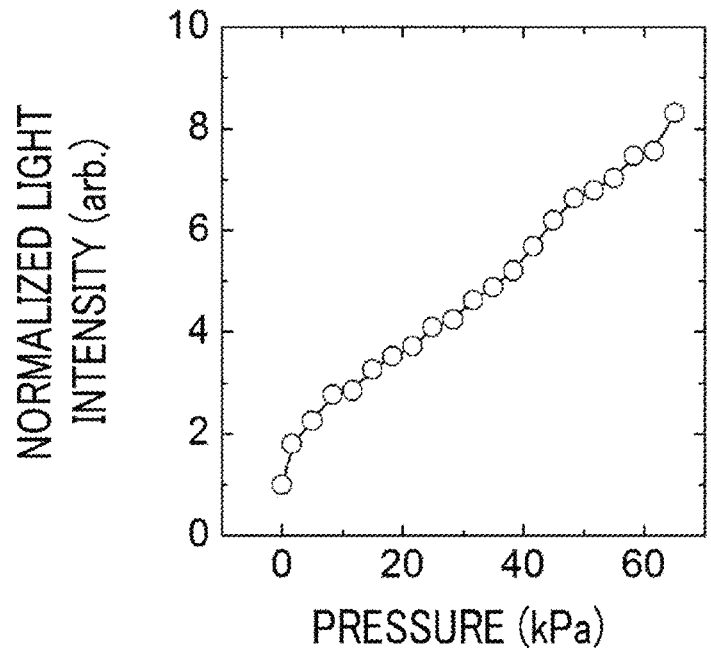
FIG. 7A and FIG. 7B provide graphs showing a change in luminous intensity depending on a pressure applied to a light emitting device manufactured according to an embodiment of the present disclosure and an elongation percentage of the light emitting device.
Figure 7B:
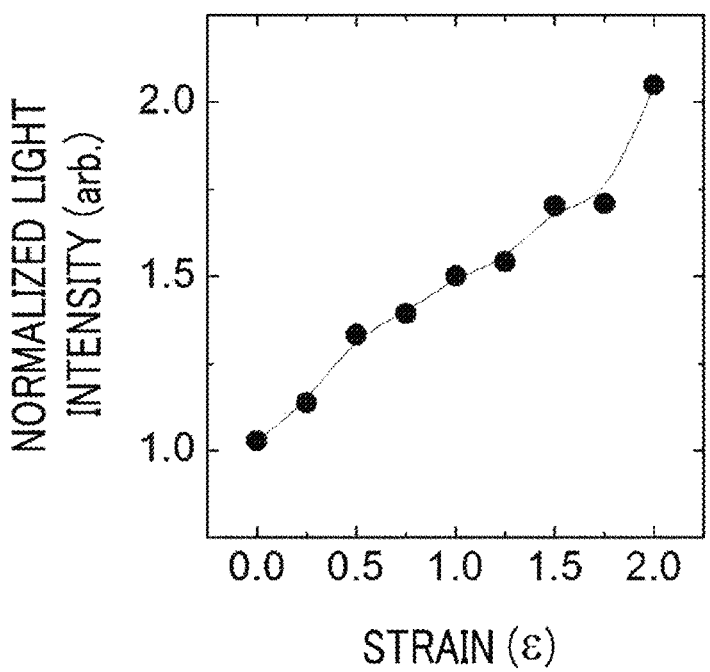

FIG. 5A and 5B provide a photo showing a light emitting state of a light emitting device manufactured according to an embodiment of the present disclosure and a driving condition graph thereof, and FIG. 6A, FIG. 6B, and FIG. 6C provide photos showing a change in luminous intensity depending on an elongation percentage of a light emitting device manufactured according to an embodiment of the present disclosure. Further, FIG. 7A and FIG. 7B provide graphs showing a change in luminous intensity depending on a pressure applied to a light emitting device manufactured according to an embodiment of the present disclosure and an elongation percentage of the light emitting device.

The light emitting device 10 manufactured according to an embodiment of the present disclosure has a high drawing ratio, a high modulus of elasticity, and a high elastic recovery.

As illustrated in FIG. 5A and FIG. 5B, a stretchable and flexible light emitting device according to an embodiment of the present disclosure is driven when applied with a voltage, and can be AC or DC driven at a low voltage.

More specifically, in the light emitting device 10 according to an embodiment of the present disclosure, when an external pressure or tensile force is applied, the segments dividing the inside of the active layer 200 are changed in shape and ions confined in the segments are released to the outside of the segments. Therefore, more ions are present in the vicinity of the first electrode 110 and the second electrode 120 and the rate of an oxidation-reduction reaction of the transition metal complex is increased, and, thus, the luminous intensity is increased.

Referring to FIG. 5A, when a voltage is applied to a light emitting device P10 manufactured according to an embodiment of the present disclosure, a light emitting state thereof can be seen. The light emitting device P10 illustrated in FIG. 5A is formed by inserting a light emitting layer between gold (Au) and indium tin oxide (ITO) electrodes, and FIG. 5A shows that the light emitting device P10 is driven by applying an AC voltage (±3 V) to the light emitting device P10. Further, referring to FIG. 5B, it can be seen that as a driving voltage is increased in the range of from 2.5 ±V to 3.0 ±V, the brightness of the light emitting device P10 is increased. The configuration and driving conditions of the light emitting device P10 are not limited thereto.

Referring to FIG. 6A, FIG. 6B, and FIG. 6C, it can be seen that as a tensile force applied to a light emitting device is increased in the order of FIG. 6A, FIG. 6B, and FIG. 6C, the luminous intensity of the light emitting device is also increased.

Further, in the case where a pressure is applied to the light emitting device (i.e., active layer) from the outside, as the intensity of the pressure is increased as shown in FIG. 7A, the normalized light intensity (i.e., luminous intensity) is increased. Furthermore, in the case where a tensile force is applied to the light emitting device, as the strain for the active layer of the light emitting device is increased (e.g., as the elongation percentage is increased) as shown in FIG. 7B, the normalized light intensity is increased. For reference, the strain refers to a value represented by a ratio of an elongated or reduced length to an original length when an object is elongated or compressed.

By using an increase in luminous intensity according to an increase in external force applied to the light emitting device 10 manufactured according to an embodiment of the present disclosure, the light emitting device 10 can be applied as a tactile sensor, a pressure sensor, and a stress sensor. A sensor configured to visualize a change in pressure applied during joint motion as the degree of brightness is an example.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A light emitting device, comprising:
   an active layer including a light emitting material, an ionic material, and a polymer matrix, wherein the active layer is capable of being compressed and elongated and formed to be changed in luminous intensity according to an increase in at least one of a pressure for the active layer and an elongation percentage of the active layer.

2. The light emitting device of claim 1, wherein the active layer is maintained or increased in luminous intensity according to an increase in at least one of the pressure and elongation percentage.

3. The light emitting device of claim 1, further comprising:
   a first electrode and a second electrode configured to apply a voltage to the active layer.

4. The light emitting device of claim 3, wherein the first electrode or the second electrode is formed of a light transmitting material.

5. The light emitting device of claim 1, wherein the light emitting material includes any one of a transition metal complex, a light emitting organic semiconductor, and a quantum dot material.

6. The light emitting device of claim 5, wherein the transition metal complex includes ruthenium (Ru) or iridium (Ir).

7. The light emitting device of claim 5, wherein the light emitting organic semiconductor includes a conjugated organic semiconductor capable of emitting light.

8. The light emitting device of claim 5, wherein the quantum dot material includes any one of inorganic compounds of elements from Groups 13 to 15, Groups 12 to 16, and Groups 14 to 16.

9. The light emitting device of claim 1, wherein the polymer matrix includes any one of a thermoplastic elastomer and a thermal curable elastomer.

10. The light emitting device of claim 1, wherein the ionic material includes any one of a liquid electrolyte and a solid electrolyte.

11. A manufacturing method for a light emitting device, comprising:
    forming a first electrode;
    forming an active layer in which a light emitting material, an ionic material, and a polymer matrix are mixed, on an upper part of the first electrode; and
    forming a second electrode on an upper part of the active layer, wherein the active layer is capable of being compressed and elongated and formed to be maintained or increased in luminous intensity according to an increase in at least one of a pressure for the active layer and an elongation percentage of the active layer.

12. The manufacturing method for a light emitting device of claim 11,
    wherein in the step of forming of the first electrode,
    a conductive material is formed on a substrate and patterned to form the first electrode, and
    the conductive material is a light transmitting material.

13. The manufacturing method for a light emitting device of claim 11, wherein the light emitting material includes any one of a transition metal complex, a light emitting organic semiconductor, and a quantum dot material.

14. The manufacturing method for a light emitting device of claim 13, wherein the transition metal complex includes ruthenium (Ru) or iridium (Ir).

15. The manufacturing method for a light emitting device of claim 13, wherein the light emitting organic semiconductor includes a conjugated organic semiconductor capable of emitting light.

16. The manufacturing method for a light emitting device of claim 13, wherein the quantum dot material includes any one of inorganic compounds of elements from Groups 13 to 15 Groups 12 to 16, and Groups 14 to 16.

17. The manufacturing method for a light emitting device of claim 11,
    wherein in the step of forming of the second electrode,
    a conductive material is formed on a substrate and patterned to form the second electrode, and
    the conductive material is a light transmitting material.

18. The manufacturing method for a light emitting device of claim 11, wherein the polymer matrix includes any one of a thermoplastic elastomer and a thermal curable elastomer.

19. The manufacturing method for a light emitting device of claim 11, wherein the ionic material includes any one of a liquid electrolyte and a solid electrolyte.

20. A sensor comprising a light emitting device of claim 1.

* * * * *

UNITED STATES PATENT AND TRADEMARK OFFICE
CERTIFICATE OF CORRECTION

PATENT NO.         : 10,411,216 B2
APPLICATION NO.    : 16/072682
DATED              : September 10, 2019
INVENTOR(S)        : Do Hwan Kim et al.

Page 1 of 1

It is certified that error appears in the above-identified patent and that said Letters Patent is hereby corrected as shown below:

In the Specification

Column 4, Line 36, "In FIG. 2B and FIG. 2B," should be -- In FIG. 2A and FIG. 2B, --.

Signed and Sealed this
Thirty-first Day of December, 2019

Andrei Iancu
*Director of the United States Patent and Trademark Office*